(12) United States Patent
Kim

(10) Patent No.: US 11,112,082 B2
(45) Date of Patent: Sep. 7, 2021

(54) VEHICULAR LED LAMP FOR FREEZING PREVENTING USING TRANSPARENT CONDUCTIVE OXIDE

(71) Applicant: Dong Sun Kim, Goyang-Si (KR)

(72) Inventor: Dong Sun Kim, Goyang-Si (KR)

(73) Assignee: CRESLITE. CO., LTD, Bucheon-si (KR)

( * ) Notice: Subject to any disclaimer, the term of this patent is extended or adjusted under 35 U.S.C. 154(b) by 63 days.

(21) Appl. No.: 16/533,496

(22) Filed: Aug. 6, 2019

(65) Prior Publication Data

US 2020/0116329 A1      Apr. 16, 2020

Related U.S. Application Data

(63) Continuation-in-part of application No. 16/156,678, filed on Oct. 10, 2018.

(51) Int. Cl.
| | |
|---|---|
| *F21S 45/60* | (2018.01) |
| *F21K 9/238* | (2016.01) |
| *F21S 41/141* | (2018.01) |
| *H05K 1/18* | (2006.01) |
| *F21S 41/32* | (2018.01) |
| *F21S 45/47* | (2018.01) |

(52) U.S. Cl.
CPC .............. *F21S 45/60* (2018.01); *F21K 9/238* (2016.08); *F21S 41/141* (2018.01); *F21S 41/32* (2018.01); *F21S 45/47* (2018.01); *H05K 1/181* (2013.01); *H05K 2201/10106* (2013.01)

(58) Field of Classification Search
CPC .. F21S 45/47; F21S 45/60; F21S 41/32; F21S 41/141; F21K 9/238; H05K 1/181; H05K 2201/10106
USPC .......................................................... 307/31
See application file for complete search history.

(56) References Cited

FOREIGN PATENT DOCUMENTS

KR      1020170027998      *  3/2013   ............ F21S 45/49

* cited by examiner

*Primary Examiner* — Hal Kaplan
(74) *Attorney, Agent, or Firm* — John K. Park; Park Law Firm

(57) ABSTRACT

The present invention relates to a vehicular LED lamp for freezing prevention using transparent conductive oxide (ITO). The vehicular LED lamp includes: a housing made of a heat dissipation material, and opened at a front side thereof, the housing including an outer shell formed to protect internal constituent elements; a headlamp LED PCB unit including one or more LEDs configured to drive a headlamp to identify the position of a vehicle; and an ITO conductive heating member deposited on the inner surface of a head lens of the LED lamp, which is coupled to the housing, the head lens being formed by depositing a diffusion preventing layer on a substrate thereof, and depositing an ITO thin film on the diffusion preventing layer, followed by thermal treatment and crystallization, thereby improving the light-outputting efficiency of an LED chip and reducing the energy consumption of the LED lamp.

15 Claims, 9 Drawing Sheets

[Figure 1]
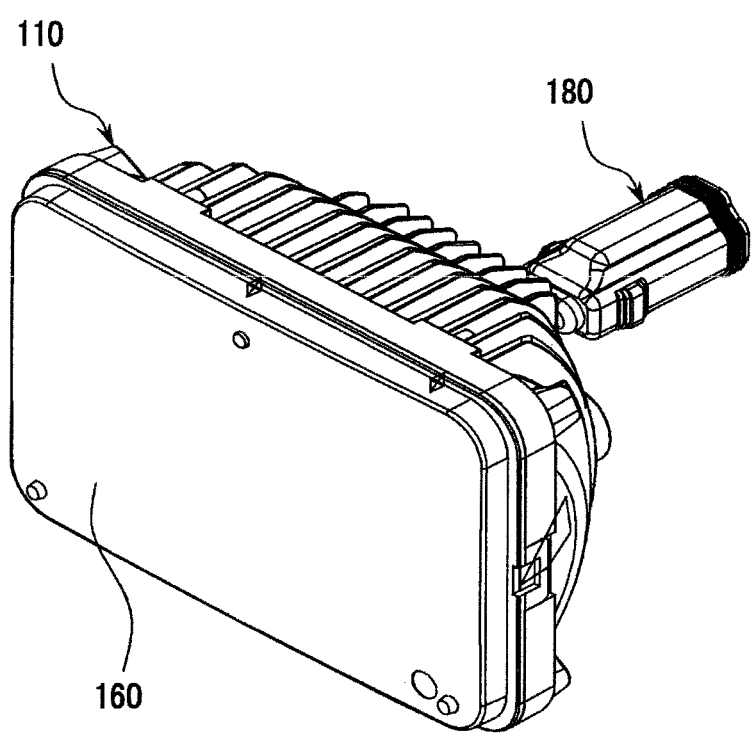

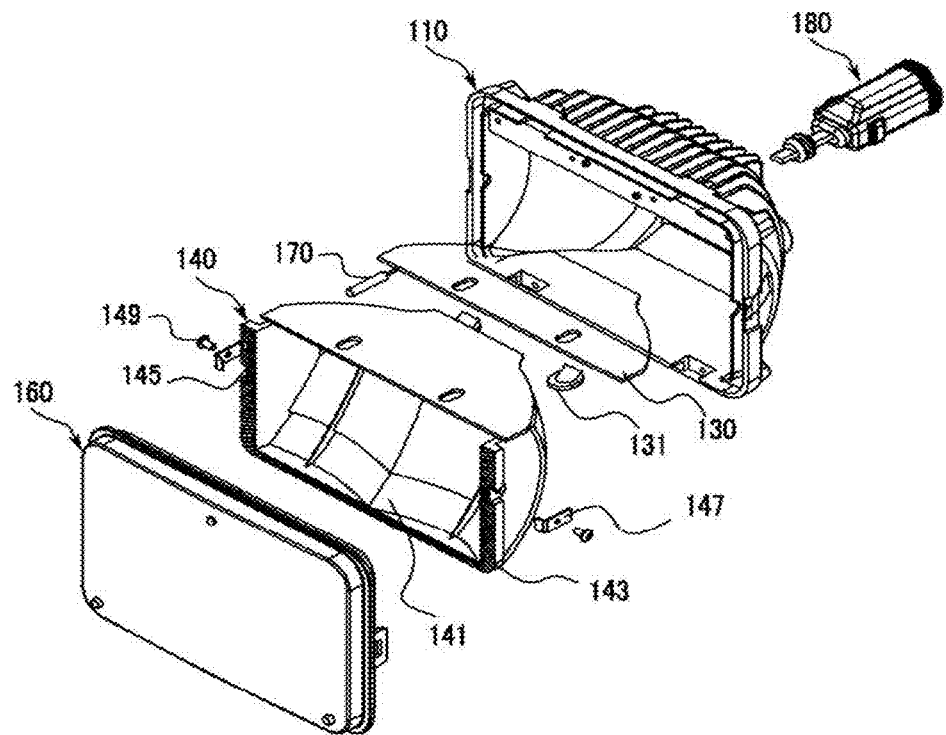
[Figure 2]

[Figure 3]
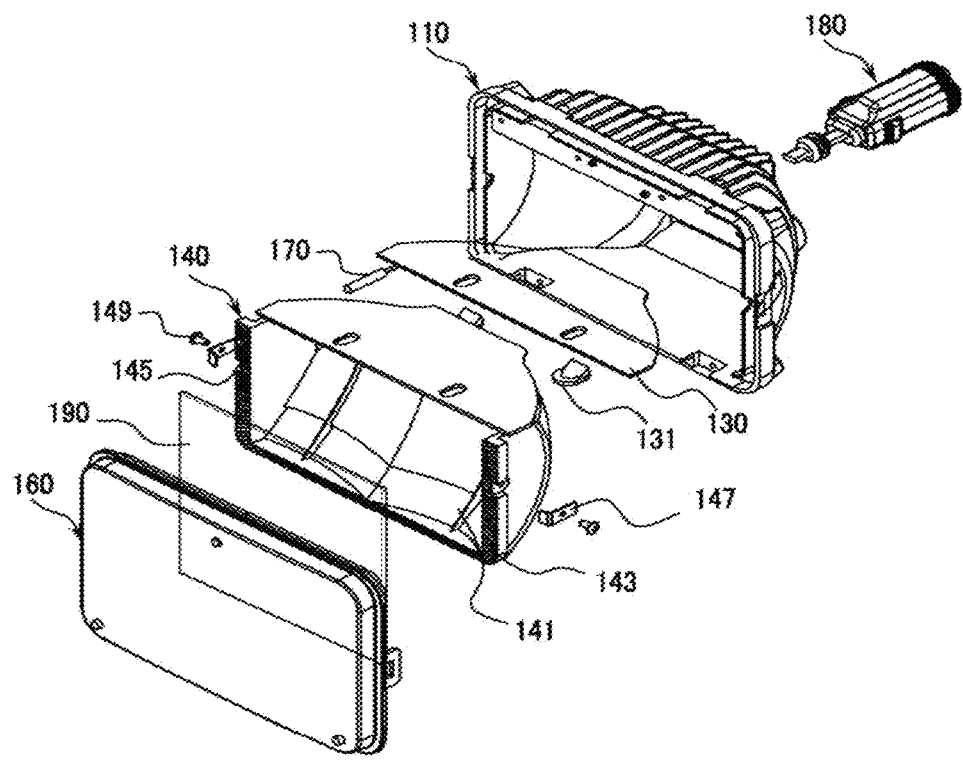

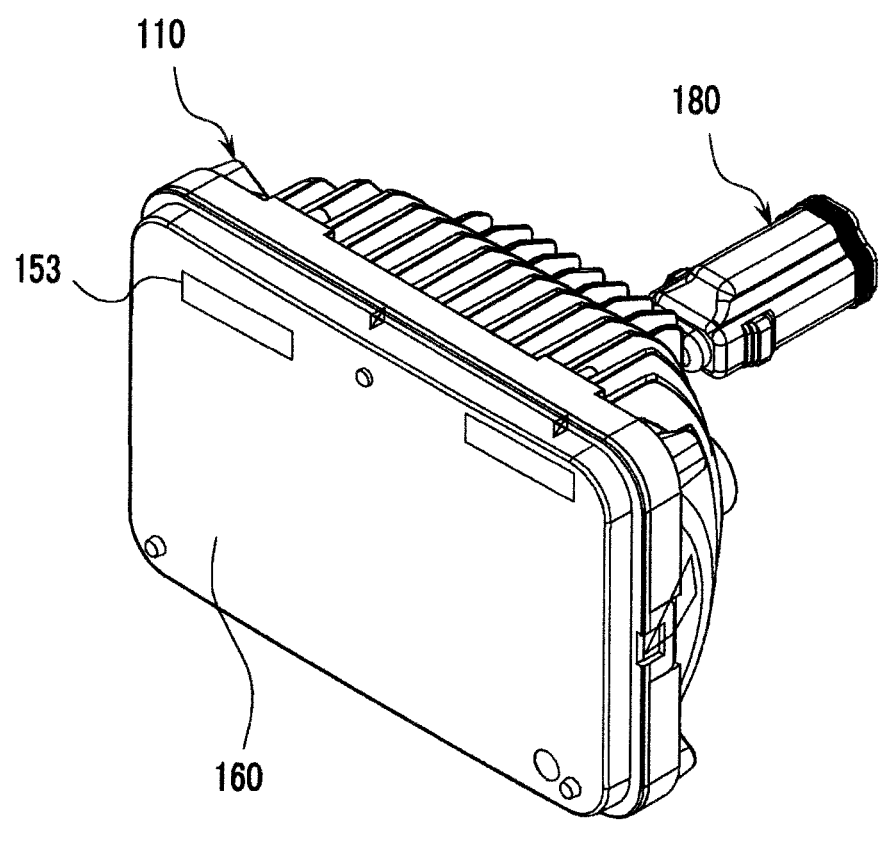
[Figure 4]

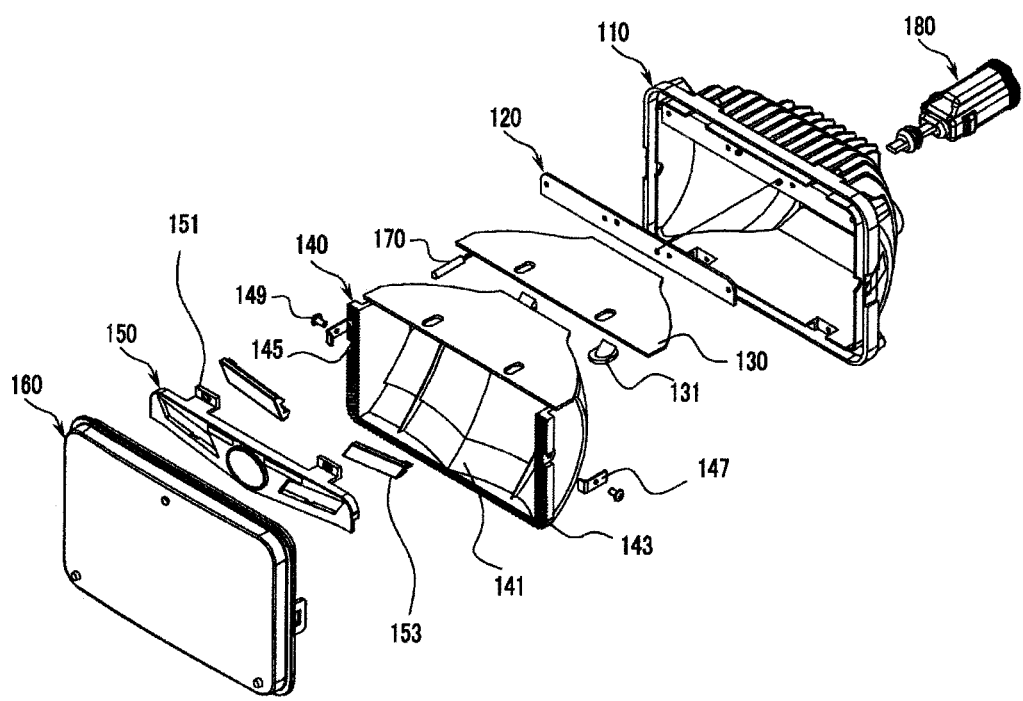
[Figure 5]

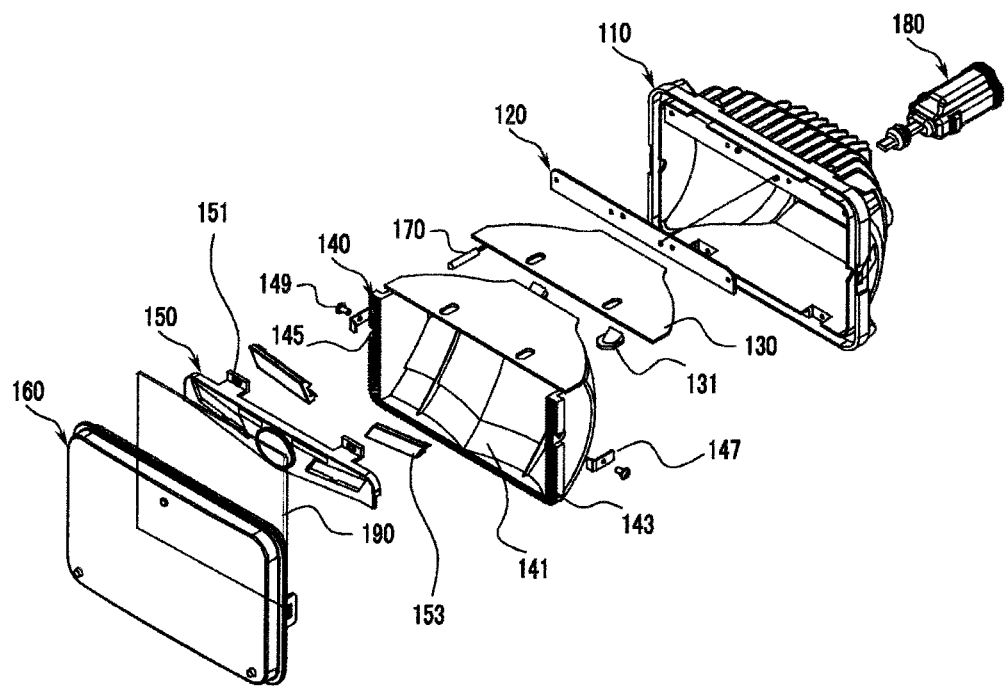
[Figure 6]

[Figure 7]
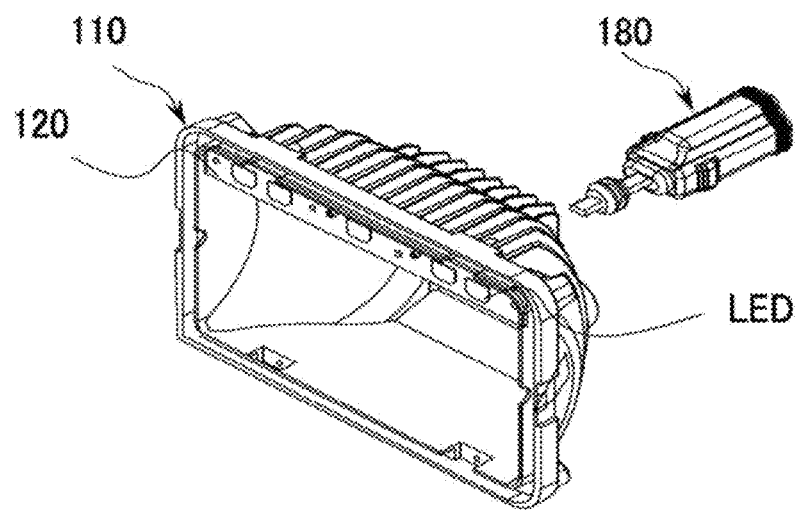
[Figure 8]
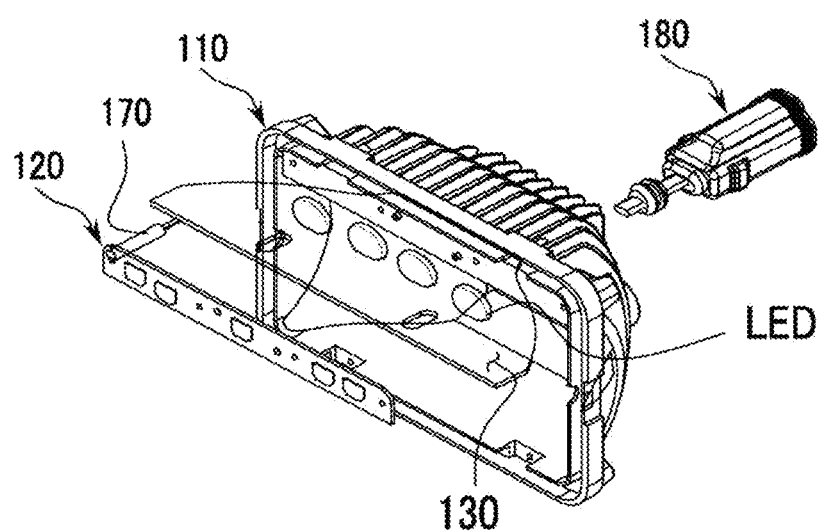

[Figure 9]
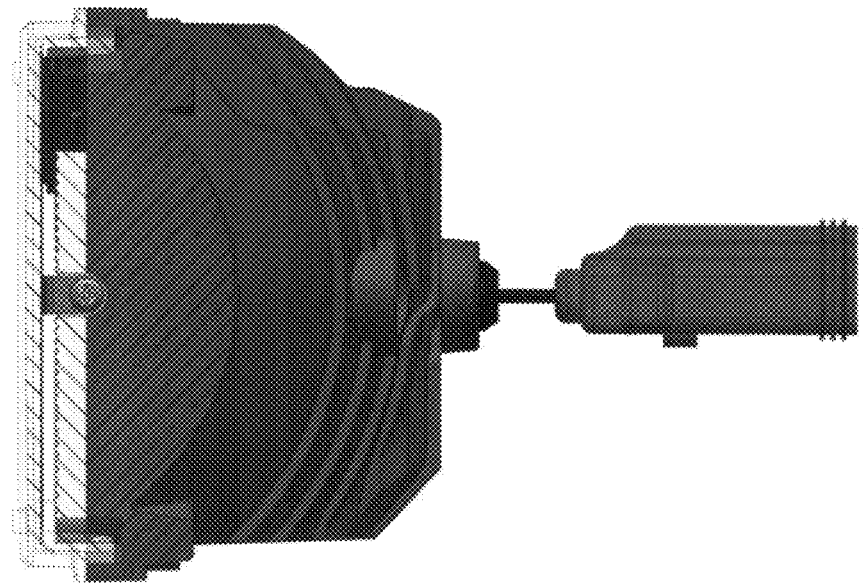
[Figure 10]
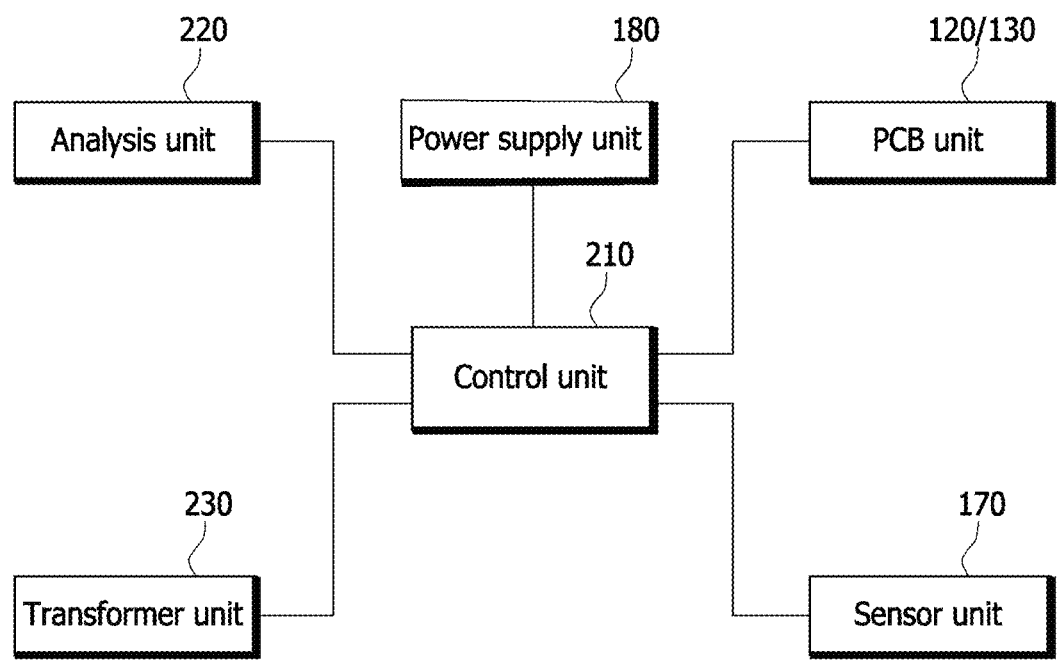

[Figure 11]
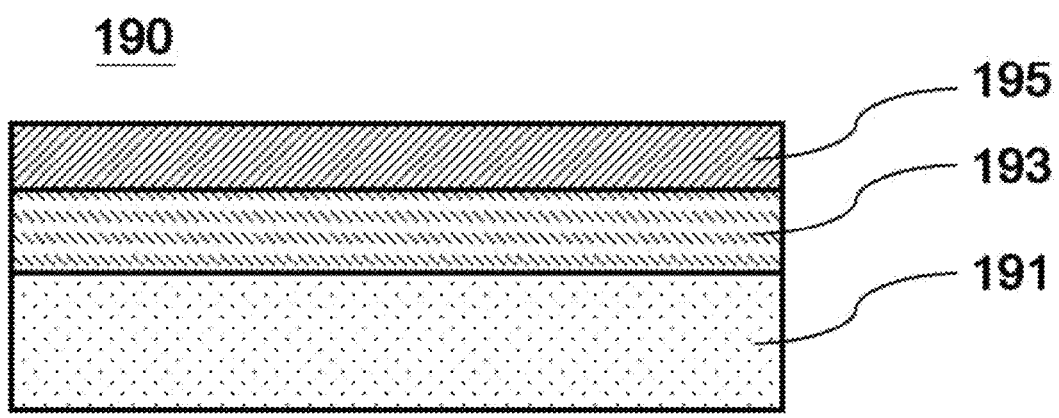

VEHICULAR LED LAMP FOR FREEZING PREVENTING USING TRANSPARENT CONDUCTIVE OXIDE

RELATED APPLICATION

This application is a continuation-in-part of U.S. patent application Ser. No. 16/156,678 for "Freezing Preventive LED Lamp" filed on Oct. 10, 2018.

BACKGROUND OF THE INVENTION

1. Field of the Invention

The present invention relates to an LED lamp, which is configured to prevent a freezing phenomenon occurring at a vehicular lamp in a severe cold environment, and more particularly, to a vehicular LED lamp for freezing prevention using transparent conductive oxide (ITO), which is configured such that ITO conductive oxide is deposited on the inner surface of a head lens or a heating member is adhered on the inner surface of the head lens to allow lighting light emitted from an LED disposed within a housing to transmit through the head lens, such that the internal temperature of the housing is sensed by a sensor unit disposed at one inner side of the housing to control the generation of heat from the heating member through the adjustment of applied voltage based on a preset temperature, and such that the lighting light emitted from the LED is controlled by the reflection of a reflector.

In addition, the present invention relates to a vehicular LED lamp for freezing prevention using transparent conductive oxide (ITO), which is configured such that a headlamp LED PCB unit is insertingly mounted at one side of the inner upper surface of a housing to allow the lighting light emitted from the LED is reflected by a reflective plate of a reflector, and ITO conductive oxide is deposited on the inner surface of a head lens or a heating member is adhered on the inner surface of the head lens in the form of a film, thereby improving the light-outputting efficiency of an LED chip and reducing the energy consumption of the LED lamp.

2. Description of Related Art

LEDs, i.e., light emitting diodes were developed as semiconductor elements that emit light when a voltage is applied in a forward direction and thus have been used in light sources of LCDs or electrical and electronic machines. However, in recent years, LEDs are used as substitutes for existing various kinds of lighting devices, owing to environmentally friendly properties, including low power consumption that is equal to one sixths of the power consumption of an incandescent bulb, long lifespan that equals to eight times of the lifespan of the incandescent bulb, and non-containing of noxious substances such as mercury and the like.

According to this technical trend, an LED lamp having various functions is used as a light source of a vehicle in replacement of a halogen lamp that has been conventionally used in a headlight for the vehicle.

In areas where snow falls frequently or severe cold regions, the freezing phenomenon occurs in which the surface of the headlamp is frozen due to low temperature and wind, snow accumulated on the vehicle, and the like. However, LEDs entails a problem in that they cannot provide a lighting light of a heating temperature enough to melt the frozen surface of the headlamp, leading to a restriction in use of the LED lamp as the light source of the vehicular headlamp.

Accordingly, in areas where lots of snow falls or severe cold regions, a halogen bulb that provides a heating temperature and a lighting light having a temperature higher than that of LEDs is applied as the light source of the vehicular headlamp so that the frozen surface of the headlamp can be melt.

However, the vehicular headlamp to which the halogen bulb is applied emits a warm white light has a shortcoming in that the headlamp has a visibility lower than that of the LED lamp that emits a cool white light, thereby decreasing visibility of a driver of a vehicle traveling a region where snow has been accumulated during the severe winter season is lowered, and thus leading to safety accidents.

Currently, an LED lamp is being developed which can be used as a vehicular headlamp even in the above-mentioned cold regions, i.e., severe cold environments. Nevertheless, the research and development of an LED lamp is still insufficient which can satisfy the intrinsic function of a lighting device while efficiently melting the frozen surface of the headlamp. Furthermore, the development of an LED lamp that meets the motor vehicle safety standards of countries such as Canada or the U.S., Russia, the East Europe, and the like is unsuccessful actually.

Therefore, the applicant has devised the present invention to solve the above-mentioned problems associated with the conventional LED lamp, and proposes a method that can use a vehicular LED headlamp in a severe cold environment.

Korean Patent Laid-Open Publication No. 10-2017-0027998 entitled "Lamp for Vehicles" has been disclosed as a prior art document related with the present invention.

SUMMARY OF THE INVENTION

Accordingly, the present invention has been made in order to solve the above-described problems occurring in the prior art, and it is an object of the present invention to provide a vehicular LED lamp for freezing prevention using transparent conductive oxide (ITO), which is configured such that ITO conductive oxide is deposited on the inner surface of a head lens or a heating member is adhered on the inner surface of the head lens to allow lighting light emitted from an LED disposed within a housing to transmit through the head lens, thereby preventing a freezing phenomenon of a vehicular headlamp, which occurs in the severe cold region, and such that the temperature of the headlamp is sensed to thaw snow or ice due to heat of the lamp, thereby providing a driver with high visibility.

To accomplish the above object, in accordance with the present invention, in one aspect, there is provided a vehicular LED lamp for freezing prevention using transparent conductive oxide (ITO), including: a housing made of a heat dissipation material, and opened at a front side thereof, the housing including an outer shell formed to protect internal constituent elements; a headlamp LED PCB unit including one or more LEDs configured to drive a headlamp to identify the position of a vehicle, the headlamp LED PCB unit being disposed at one side of the inner upper portion of the housing in such a manner as to be fixedly supported by a PCB coupling member; and an ITO conductive heating member deposited on the inner surface of a head lens of the LED lamp, which is coupled to the housing, the head lens being formed by depositing a diffusion preventing layer using inorganic oxide such as $SiO_2$, $Nb_2O_5$, $TiO_2$ or the like on a substrate thereof, and depositing an ITO thin film on the diffusion preventing layer, followed by thermal treatment and crystallization, so that the light-outputting efficiency of an LED chip can be improved and the energy consumption of the LED lamp can be reduced.

In another aspect, there is provided a vehicular LED lamp for freezing prevention using transparent conductive oxide (ITO) according to an embodiment of the present invention, including: a housing made of a heat dissipation material, and opened at a front side thereof, the housing including an outer shell formed to protect internal constituent elements; a headlamp LED PCB unit including one or more LEDs configured to drive a headlamp to identify the position of a vehicle, the headlamp LED PCB unit being disposed at one side of the inner upper portion of the housing in such a manner as to be fixedly supported by a PCB coupling member; and a transparent conductive oxide (ITO)-containing heating member attached to the inner surface of a head lens of the LED lamp, which is coupled to the housing, in the form of a film, so that the light-outputting efficiency of an LED chip can be improved and the energy consumption of the LED lamp can be reduced.

In addition, the vehicular LED lamp for freezing prevention using transparent conductive oxide (ITO) according to an embodiment of the present invention may further include a sensor unit having a structure of being formed integrally or engaged with the headlamp LED PCB unit at the inside of the housing, the sensor unit being configured sense the internal temperature of the housing; and a control unit configured to determine whether to supply power to the ITO heating member based on the internal temperature of the housing, sensed by the sensor unit, through the control of power of a power supply unit.

In addition, the vehicular LED lamp for freezing prevention using transparent conductive oxide (ITO) according to an embodiment of the present invention may further include a reflector disposed at the inside of the housing and configured to reflect lighting light emitted from the LEDs of the headlamp LED PCB unit, wherein a reflective plate inserted into an internal space portion and configured to receive lighting light emitted from the LEDs of the headlamp LED PCB unit; a frame unit formed to extend protrudingly radially from a front end of the reflective plate in such a manner as to be connected to a front end of the housing; a pair of opposed electrode guide grooves recessedly formed on the central surfaces of a pair of opposed vertical portions of the frame unit; and a pair of opposed fastening terminals connected to the LED PCB unit 130 by means of electric wires and inserted into the pair of opposed electrode guide grooves so that when the head lens and the housing are securely fastened to each other by means of a bolt, an electrical conduction is established between the headlamp LED PCB unit and the head lens.

Moreover, in the vehicular LED lamp for freezing prevention using transparent conductive oxide (ITO) according to an embodiment of the present invention, the reflective plate may be configured to allow the lighting light emitted from the LEDs of the headlamp LED PCB unit to be reflected to the inner surface of the head lens, and to have a curved shape so as to condense and reflect the lighting light emitted from the LEDs of the headlamp LED PCB unit, the reflective plate being accommodated in the internal space of the housing.

Effects of the Invention

As described above, the vehicular LED lamp for freezing prevention using transparent conductive oxide (ITO) according the present invention has advantageous effects in that the temperature of the headlamp is sensed to thaw snow or ice formed around the lamp due to heat of the lamp itself without using a separate power source so as to prevent a freezing phenomenon of a vehicular headlamp, which occurs in the severe cold region and provide a driver with high visibility, thereby providing a convenience of use.

In addition, the vehicular LED lamp for freezing prevention using transparent conductive oxide (ITO) according to the present invention has advantageous effects in that ITO conductive oxide is deposited on the inner surface of a head lens or a heating member is adhered on the inner surface of the head lens to allow lighting light emitted from an LED disposed within a housing to transmit through the head lens, in that the internal temperature of the housing is sensed by a sensor unit disposed at one inner side of the housing to control the generation of heat from the heating member through the adjustment of applied voltage based on a preset temperature, and in that the lighting light emitted from the LED is controlled by the reflection of a reflector, thereby prolonging the lifespan of the LED elements.

Further, the vehicular LED lamp for freezing prevention using transparent conductive oxide (ITO) according to the present invention has advantageous effects in that it has a structure in which an LED is used as a lighting source emitting a lighting light through an LED PCB unit and a heating member is deposited or adhered on the inner surface of a head lens in the form of a film to prevent a freezing phenomenon of the headlamp, leading to a reduction in the operation costs according to the operation of vehicles or the manufacture costs of the lamp, and an increase in a driver's visibility.

Further, the vehicular LED lamp for freezing prevention using transparent conductive oxide (ITO) according to the present invention has advantageous effects in that it is configured such that a headlamp LED PCB unit is insertingly mounted at one side of the inner upper surface of a housing to allow the lighting light emitted from the LED is reflected by a reflective plate of a reflector, and ITO conductive oxide is deposited on the inner surface of the head lens or a heating member is adhered on the inner surface of the head lens in the form of a film, thereby improving the light-outputting efficiency of an LED chip and reducing the energy consumption of the LED lamp.

Further, the LED lamp for prevention of freezing according to an embodiment of the present invention is configured to sense the temperature of a vehicular headlamp in real time and melt snow or ice stuck to the surface of the headlamp using a power source of a vehicle itself without any use of a separate external power source, thereby preventing a freezing phenomenon of a vehicular headlamp, which occurs in the severe cold region, and the same time providing a driver with high visibility, and thus ensuring a safe driving environment at night or in the early dawn time.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 1 is an assembled perspective view illustrating a transparent conductive oxide (ITO)-deposited or heating film-attached LED lamp for freezing prevention according to one embodiment of the present invention;

FIG. 2 is a front exploded perspective view illustrating the LED lamp shown in FIG. 1 in a state where ITO is deposited;

FIG. 3 is a front exploded perspective view illustrating the LED lamp shown in FIG. 1 in a state where the heating film is attached;

FIG. 4 is an assembled perspective view illustrating a transparent conductive oxide (ITO)-deposited or heating film-attached LED lamp for freezing prevention according to another embodiment of the present invention;

FIG. 5 is a front exploded perspective view illustrating the LED lamp shown in FIG. 4 in a state where ITO is deposited;

FIG. 6 is a front exploded perspective view illustrating the LED lamp shown in FIG. 4 in a state where the heating film is attached;

FIG. 7 is a front exploded perspective view illustrating the LED lamp in which a PCB unit according to the present invention is mounted to the inside of a housing;

FIG. 8 is a front exploded perspective view illustrating the LED lamp in which a headlamp LED unit according to the present invention is mounted to the inside of a housing;

FIG. 9 is a side cross-sectional view illustrating the LED lamp in which a head lens and a housing are coupled to each other by means of a fastening terminal;

FIG. 10 is a block diagram illustrating an inner configuration of an LED lamp for freezing prevention according to the present invention; and FIG. 11 is a cross-sectional view illustrating an ITO heating film shown in FIG. 4.

[Explanation on symbols]

| | |
|---|---|
| 100: vehicular LED lamp | |
| 110: housing | 120: PCB unit |
| 130: headlamp LED PCB unit | |
| 131: PCB coupling member | |
| 140: reflector | 141: reflective plate |
| 143: frame unit | 145: electrode guide groove |
| 147: fastening terminal | 149: bolt |
| 150: support unit | 151: retaining protrusion |
| 153: lighting lens | |
| 160: head lens | |
| 170: sensor unit | 180: power supply unit |
| 190: heating member | 191: substrate film |
| 193: optical adjustment layer | |
| 195: coating layer | |
| 210: control unit | 220: analysis unit |
| 230: transformer unit | |

DETAILED DESCRIPTION OF THE PREFERRED EMBODIMENTS

Advantages and features of the present disclosure and an LED lamp for accomplishing the advantages and feature will be apparent by way of embodiments which will be described in detail later with reference to the accompanying drawings.

However, the present invention is not limited to embodiments disclosed below but may be implemented into different forms. Embodiments are provided only for illustrative purposes and for full understanding of the scope of the present invention by those skilled in the art, and the scope of the present invention is defined by the appended claims.

Hereinafter, a configuration of an LED lamp for freezing prevention according to an embodiment of the present invention will be described in detail with reference to the accompanying drawings so that a person of ordinary skill in the art can easily understand and carry out the present invention. In the following description, the detailed description on relevant known functions and constructions unnecessarily obscuring the subject matter of the present invention will be avoided hereinafter.

FIG. 1 is an assembled perspective view illustrating a transparent conductive oxide (ITO)-deposited or heating film-attached LED lamp for freezing prevention according to one embodiment of the present invention, FIG. 2 is a front exploded perspective view illustrating the LED lamp shown in FIG. 1 in a state where ITO is deposited, and FIG. 3 is a front exploded perspective view illustrating the LED lamp shown in FIG. 1 in a state where the heating film is attached.

The LED lamp 100 for freezing prevention according to an embodiment of the present invention includes a housing 110, a headlamp LED PCB unit 130, a reflector 140, and a head lens 160.

A configuration and operation of the LED lamp 100 will be described hereinafter.

The housing 110 is made of a heat dissipation material, is opened at a front side thereof, and includes an outer shell formed to protect internal constituent elements. The headlamp LED PCB unit 130 includes one or more LEDs configured to drive a headlamp to identify the position of a vehicle and is disposed at one side of the inner upper portion of the housing 110 in such a manner as to be fixedly supported by a PCB coupling member 131. The head lens 160 is coupled to the housing 110, and an ITO conductive heating member 190 is deposited on the inner surface of the head lens 160.

In other words, the head lens 160 is formed by depositing a diffusion preventing layer using inorganic oxide such as $SiO_2$, $Nb_2O_5$, $TiO_2$ or the like on a substrate thereof, and depositing an ITO thin film on the diffusion preventing layer, followed by thermal treatment and crystallization so that the light-outputting efficiency of an LED chip can be improved with respect to light emitted from LEDs of the headlamp LED PCB unit 130 and the energy consumption of the LED lamp can be reduced.

FIG. 4 is an assembled perspective view illustrating a transparent conductive oxide (ITO)-deposited or heating film-attached LED lamp for freezing prevention according to another embodiment of the present invention, FIG. 5 is a front exploded perspective view illustrating the LED lamp shown in FIG. 4 in a state where ITO is deposited, FIG. 6 is a front exploded perspective view illustrating the LED lamp shown in FIG. 4 in a state where the heating film is attached.

The LED lamp 100 for freezing prevention according to another embodiment of the present invention includes a housing 110, a PCB unit 120, a headlamp LED PCB unit 130, a reflector 140, a support unit 150, a head lens 160, a sensor unit 170, a power supply unit 180, and an ITO heating member 190.

A configuration and operation of the LED lamp 100 will be described hereinafter.

The housing 110 is made of a heat dissipation material, is opened at a front side thereof, and includes an outer shell formed to protect internal constituent elements. The housing 110 may be mounted at a front portion of a vehicle, and has a predetermined internal space defined therein to allow a sensor unit 170 and a reflector 140 to be accommodated therein.

The PCB unit 120 includes one or more LEDs as shown in FIG. 7 and is accommodatingly disposed at a front side of the inner upper surface of the housing 110. The headlamp LED PCB unit 130 includes one or more LEDs configured to drive a headlamp to remotely identify the position of a vehicle, and as shown in FIG. 8, The headlamp LED PCB unit 130 is disposed at one side of the inner upper portion of the housing 110 in such a manner as to be fixedly supported by a PCB coupling member 131. That is, the reflector 140 is disposed at the inside of the housing 110 so as to reflect lighting light emitted from LEDs of the headlamp LED PCB unit 130.

The reflector 140 includes a reflective plate 141 inserted into an internal space portion and configured to receive lighting light emitted from the LEDs of the headlamp LED PCB unit 130; a frame unit 143 formed to extend protrudingly radially from a front end of the reflective plate 141 in such a manner as to be connected to a front end of the housing 110; and a pair of opposed electrode guide grooves 145 recessedly formed on the central surfaces of a pair of opposed vertical portions of the frame unit 143.

In addition, the reflector 140 further includes a pair of opposed fastening terminals 147 inserted into the pair of opposed electrode guide grooves 145 so that the head lens 160 and the housing 110 are securely fastened to each other by means of a bolt 149. The fastening terminal 147 fixedly supports one side of the upper portion of the head lens 160 and is secured to the housing 110 by the bolt 149 as shown in FIG. 5.

The reflective plate 141 serves to allow the lighting light emitted from the LEDs of the headlamp LED PCB unit 130 to be reflected to the inner surface of the head lens 160. The reflective plate 141 has a curved shape so as to efficiently condense and reflect the lighting light emitted from the LEDs of the headlamp LED PCB unit 130, and may have a shape which can be accommodated in the internal space of the housing 110.

Thus, the lighting light reflected to the internal space of the housing 110 from the LEDs of the headlamp LED PCB unit 130 is reflected by the reflective plate 141 and transferred to the head lens 160.

The frame unit 143 is an element that is contactingly connected to a front end of the housing 110 and functions as a known flange. The pair of opposed electrode guide grooves 145 are respectively recessedly formed on the central surfaces of a pair of opposed vertical portions of the frame unit 143.

The vehicular LED lamp for freezing prevention using transparent conductive oxide (ITO) according to the present invention further includes a support unit 150 including a pair of retaining protrusions 151 formed thereon so as to be engaged with the inside of the housing 110 to protect the PCB 120 accommodated in the inner upper portion of the housing 110.

The support unit 150 is securely fixed to the inside of the housing 110 by means of the retaining protrusions 151 when the housing 110 and the head lens 160 are engaged with each other by means of the fastening terminals 147 and the bolts 149, and the support unit 150 is mounted on the inner surface of the head lens 160.

In other words, the fastening terminals 147 are connected to the LED PCB unit 130 by means of electric wires and are inserted into the pair of opposed electrode guide grooves 145 so that when the head lens 160 and the housing 110 are securely fastened to each other by means of a bolt 149, an electrical conduction is established between the headlamp LED PCB unit 130 and the head lens 160.

The head lens 160 can be formed by adhering the ITO conductive heating member 190 on the inner surface thereof in order to prevent a freezing phenomenon. The ITO heating member 190 may be adheringly disposed on the inner surface of the head lens 160, which confronts the reflective plate 141 of the reflector 140.

In this case, the ITO heating member 190 adhered to the inner surface of the head lens 160 can be configured such that a heating member 190 containing transparent conductive oxide (e.g., indium tin oxide (ITO)) is adhered to the inner surface of the head lens 160 in the form of a film, thereby improving the light-outputting efficiency of an LED chip and reducing the energy consumption of the LED lamp.

The sensor unit 170 has a structure of being formed integrally or engaged with the headlamp LED PCB unit 130 at the inside of the housing 110, and senses the internal temperature of the housing 110. The vehicular LED lamp for freezing prevention using transparent conductive oxide (ITO) according to the present invention further includes a control unit 210 configured to determine whether to supply power to the ITO heating member based on the internal temperature of the housing 110, sensed by the sensor unit 170, through the control of power of the power supply unit 180.

The sensor unit 170 senses the internal temperature of the housing 110 as shown in FIG. and may be implemented as various known temperature detection sensors.

More specifically, the sensor unit 170 is preferably disposed at a position that is not influenced by the lighting light emitted from the headlamp LED PCB unit 130 or the lighting light reflected by the reflector 140. In addition, the sensor unit 170 is preferably disposed at a position that is not influenced by heat generated from other electrical and electronic components provided inside the housing 110.

In the meantime, the ITO conductive heating member 190 is deposited on the inner surface of the head lens 160 for the purpose of prevention of freezing. More specifically, the head lens 160 of the LED lamp for prevention of freezing is formed by depositing a diffusion preventing layer on a substrate thereof, and depositing an ITO thin film on the diffusion preventing layer, followed by thermal treatment and crystallization. As such, the ITO deposited lens is manufactured by being molded as the head lens 160 of the vehicular LED lamp depending on the use purpose and size.

In this case, the diffusion preventing layer deposited on the substrate of the head lens 160 can be formed by using inorganic oxide such as $SiO_2$, $Nb_2O_5$, $TiO_2$ or the like, $SiO_2$ having a high thin film formation rate, or $Al_2O_3$ having excellent diffusion preventing properties.

The diffusion preventing layer is activated in a high-temperature process in which Na ions contained in the lens composition form ITO's transparent conductivity, so that it serves to suppress an ITO transparent conductive film diffusion phenomenon, improves the illuminance of the lens to form a flat ITO thin film, and enables manufacturing of a thin film product having conductivity equivalent to high visible light transmittance.

The deposited ITO conductive film was heat-treated in an $N_2$ atmosphere using an alumina tube furnace, the ramp rate of a heat treatment furnace is maintained at 5° C./min, and the ITO conductive film is heat-treated at a temperature of 400° C. for 20 to 120 minutes.

In this case, examples of an ITO conductive film formation method include sputtering, E-beam evaporation, chemical vapor deposition, ion-plating, and the like. Among them, the sputtering method is widely used and desirable.

In the sputtering method, the substrate is a substrate on which an $Al_2O_3$-containing diffusion preventing layer is formed, and an $Al_2O_3$ thin film was deposited at room temperature using an $Al_2O_3$ target having a purity of 99.99%. The initial film formation temperature of the ITO thin film is the room temperature, and a sputtering target has a ratio of $In_2O_3$ (90 wt %):$SnO_2$ (10 wt %). Argon and oxygen are used as a deposition gas, and an AC reactive magnetron sputtering technique is used.

In the meantime, as shown in FIGS. 3 and 6, the head lens 160 can be formed by adhering the ITO conductive heating member 190 on the inner surface thereof in order to prevent a freezing phenomenon. The ITO heating member 190 may be adheringly disposed on the inner surface of the head lens 160, which confronts the reflective plate 141 of the reflector 140.

In this case, the ITO heating member 190 adhered to the inner surface of the head lens 160 can be configured such that a heating member 190 containing transparent conductive oxide (e.g., indium tin oxide (ITO)) is adhered to the inner surface of the head lens 160 in the form of a film, thereby improving the light-outputting efficiency of an LED chip and reducing the energy consumption of the LED lamp.

As shown in FIG. 11, the ITO heating member 190 includes a substrate film 191, an optical adjustment layer 193 laminated on the substrate film 191 and including a low refractive index layer, and a coating layer 195 formed on the optical adjustment layer and coated with a resin coating solution containing a fluorine additive.

In this case, the substrate film 191 uses a polymer or copolymer having, as a constituent unit, any one selected from among ester, ethylene, propylene, diacetate, triacetate, styrene, carbonate, methylpentene, mefone, etherethylketone, imide, fluorine, nylon, acrylate, and alicyclic olefin. The polymer or copolymer provides uniformity of transparency, strength and thickness.

The optical adjustment layer 193 includes a low refractive index layer containing a binder component and a fluorine additive, and inorganic particles may be used.

An acrylate resin is used as the binder component constituting the low refractive index layer. The binder component can improve solvent resistance and hardness.

FIG. 10 is a block diagram illustrating an inner configuration of an LED lamp for freezing prevention according to the present invention As shown in FIGS. 1 to 3, the control unit 210 is supplied with power from the power supply unit 180 such as a vehicle battery for application to the PCB unit 120 and the headlamp LED PCB unit 130, and controls the overall operation of the constituent elements so that the power is supplied to the LEDs or the headlamp LEDs to drive the LEDs or the headlamp LEDs.

In addition, the control unit 210 determines whether to operate the sensor unit 170 for measuring the internal temperature of the housing 110, and applies a corresponding transmission signal to the sensor unit 170, applies a signal for driving the power supply unit 180 based on the internal temperature of the housing 110, sensed by the sensor unit 170, or applies a control signal for driving the lighting lens 153 (as shown in FIG. 6) or the headlamp LEDs.

In other words, the control unit 210 boosts an applied voltage for driving the lighting LEDs that emit light upwardly or downwardly or the headlamp LEDs if the internal temperature of the housing 110, sensed by the sensing unit 150, is a preset temperature or higher, and drops the applied voltage for driving the lighting LEDs or the headlamp LEDs if the internal temperature of the housing 110, sensed by the sensing unit 150, is the preset temperature or lower so as to determine whether to drive the heating member 190.

Thus, the control unit 210 controls an analysis unit 220 to compare the internal temperature of the housing 110, sensed by the sensor unit 170, with the preset temperature and analyze a result of the comparison, receives the analyzed result of the comparison from the analysis unit 220, and controls a transformer unit 230 to be driven to boost or drop a voltage to be applied to the heating member 190 so as to drive the lighting LEDs or the headlamp LEDs.

For reference, the preset temperature can be set to about 40° C. to 60° C., and may be within a temperature range sufficient for melting snow or ice adhered to the surface of the head lens 160. For example, the control unit 220 can determine that snow or ice is adhered to the surface of the lens 130 if the internal temperature of the housing 110 is lower than 40° C., and determine that no snow or ice is adhered to the surface of the lens 130 if the internal temperature of the housing 110 is higher than 40° C.

Therefore, if the internal temperature of the housing 110 is lower than 40° C., a voltage being applied to the heating member 190 can be boosted to heat the heating member 190, and thus snow or ice adhered to the surface of the head lens 160 is melted.

On the contrary, if the internal temperature of the housing 110 is higher than 40° C., a voltage being applied to the heating member 190 can be dropped to reduce the amount of power consumed.

For reference, if the internal temperature of the housing 110 is higher than 60° C., it is preferred that the amount of power being applied to the heating member 190 is controlled to be reduced without blocking a voltage being applied to the heating member 190 so that the inside of the housing 110 can be constantly maintained at a warm temperature (i.e., a temperature at which the lens surface is enough not to be frozen).

The vehicular LED lamp for freezing prevention using transparent conductive oxide (ITO) according to the present invention as constructed above can promptly resolve a freezing phenomenon of a vehicular headlamp, which occurs in the severe cold region or in the cold weather so that a driver can stably drive a vehicle even at night or in the early dawn time.

Further, the vehicular LED lamp for freezing prevention using transparent conductive oxide (ITO) according to one embodiment of the present invention has a structure in which an LED is used as a lighting source emitting a lighting light to prevent a freezing phenomenon in which the surface of the headlamp is frozen, leading to a reduction in the operation costs according to the operation of vehicles or the manufacture costs of the lamp, as well as an increase in a driver's visibility.

While the present invention has been described in connection with the exemplary embodiments illustrated in the drawings, they are merely illustrative embodiments, and the invention is not limited to these embodiments. It is to be understood that various equivalent modifications and variations of the embodiments can be made by a person having an ordinary skill in the art without departing from the spirit and scope of the present invention. Therefore, various embodiments of the present invention are merely for reference in defining the scope of the invention, and the true technical scope of the present invention should be defined by the technical spirit of the appended claims.

What is claimed is:

1. A vehicular LED lamp for freezing prevention using a transparent conductive oxide, comprising:
    a housing (110) made of a heat dissipation material, and opened at a front side thereof, the housing including an outer shell formed to protect internal constituent elements;
    a headlamp LED PCB unit (130) including one or more LEDs configured to drive a headlamp to identify the position of a vehicle, the headlamp LED PCB unit being disposed at one side of the inner upper portion of the housing in such a manner as to be fixedly supported by a PCB coupling member; and A conductive heating member deposited on the inner surface of a head lens (160) of the LED lamp, which is coupled to the housing (110), the head lens (160) being formed by depositing a diffusion preventing layer using inorganic oxide on a substrate thereof, and depositing an transparent conductive oxide thin film on the diffusion preventing layer, followed by thermal treatment and crystallization, so that the light-outputting efficiency of an LED chip can be improved and the energy consumption of the LED lamp can be reduced.

2. A vehicular LED lamp for freezing prevention using a transparent conductive oxide, comprising:

a housing (110) made of a heat dissipation material, and opened at a front side thereof, the housing including an outer shell formed to protect internal constituent elements;

a headlamp LED PCB unit (130) including one or more LEDs configured to drive a headlamp to identify the position of a vehicle, the headlamp LED PCB unit being disposed at one side of the inner upper portion of the housing (110) in such a manner as to be fixedly supported by a PCB coupling member; and a transparent conductive oxide containing heating member (190) attached to the inner surface of a head lens (160) of the LED lamp, which is coupled to the housing (110), in the form of a film, so that the light-outputting efficiency of an LED chip can be improved and the energy consumption of the LED lamp can be reduced.

3. The vehicular LED lamp for freezing prevention using a transparent conductive oxide according to claim 1 or 2, further comprising:

a sensor unit (170) having a structure being formed integrally or engaged with the headlamp LED PCB unit (130) at the inside of the housing (110), the sensor unit (170) being configured to sense the internal temperature of the housing (110); and a control unit (210) configured to determine whether to supply power to a transparent conductive oxide containing heating member based on the internal temperature of the housing (110), sensed by the sensor unit (170), through the control of power of a power supply unit (180).

4. The vehicular LED lamp for freezing prevention using a transparent conductive oxide according to claim 3, wherein the control unit (210) controls an analysis unit (220) to compare the internal temperature of the housing (110), sensed by the sensor unit (170), with a preset temperature and analyze a result of the comparison, receives the analyzed result of the comparison from the analysis unit (220), and controls a transformer unit (230) to be driven to boost or drop a voltage to be applied to the heating member (190).

5. The vehicular LED lamp for freezing prevention using a transparent conductive oxide according to claim 1 or 2, further comprising:

a reflector (140) disposed at the inside of the housing (110) and configured to reflect lighting light emitted from the LEDs of the headlamp LED PCB unit (130), wherein the reflector (140) comprises:

a reflective plate (141) inserted into an internal) space portion and configured to receive lighting light emitted from the LEDs of the headlamp LED PCB unit (130), a frame unit (143) formed to extend protrudingly radially from a front end of the reflective plate (141) in such a manner as to be connected to a front end of the housing (110);

a pair of opposed electrode guide grooves (145) recessedly formed on the central surfaces of a pair of opposed vertical portions of the frame unit (143); and a pair of opposed fastening terminals (147) connected to the LED PCB unit (130) by electric wires and inserted into the pair of opposed electrode guide grooves (145) so that when the head lens (160) and the housing (110) are securely fastened to each other by a bolt (149), an electrical conduction is established between the headlamp LED PCB unit (130) and the head lens (160).

6. The vehicular LED lamp for freezing prevention using a transparent conductive oxide according to claim 5, wherein the reflective plate (141) is configured to allow the lighting light emitted from the LEDs of the headlamp LED PCB unit (130) to be reflected to the inner surface of the head lens (160), and to have a curved shape so as to condense and reflect the lighting light emitted from the LEDs of the headlamp LED PCB unit (130), the reflective plate (141) being accommodated in the internal space of the housing (110).

7. The vehicular LED lamp for freezing prevention using a transparent conductive oxide according to claim 1 or 2, further comprising:

a PCB unit (120) including one or more LEDs and configured to be accommodated in the inner upper portion of the housing (110) to allow the light emitted from the LEDs to be irradiated in an upward or downward direction; and a support unit (150) including a pair of retaining protrusions (151) formed thereon so as to be engaged with the inside of the housing (110) to protect the PCB (120), and a pair of lighting lenses (153) formed on the outer surface thereof.

8. The vehicular LED lamp for freezing prevention using a transparent conductive oxide according to claim 2, wherein the transparent conductive oxide containing heating member (190) comprises a substrate film (191), an optical adjustment layer (193) laminated on the substrate film (191) and including a low refractive index layer, and a coating layer formed on the optical adjustment layer and coated with a resin coating solution containing a fluorine additive.

9. A vehicular LED lamp for freezing prevention using a transparent conductive oxide, comprising:

a housing (110) made of a heat dissipation material, and opened at a front side thereof, the housing including an outer shell formed to protect internal constituent elements;

a headlamp LED PCB unit (130) including one or more LEDs attached to a headlamp to identify the position of a vehicle, the headlamp LED PCB unit being disposed at one side of the inner upper portion of the housing in such a manner as to be fixedly supported by a PCB coupling member; and A conductive heating member deposited on the inner surface of a head lens (160) of the LED lamp, which is coupled to the housing (110), the head lens (160) being formed by depositing a diffusion preventing layer using inorganic oxide on a substrate thereof, and depositing an transparent conductive oxide thin film on the diffusion preventing layer, followed by thermal treatment and crystallization, so that the light-outputting efficiency of an LED chip can be improved and the energy consumption of the LED lamp can be reduced.

10. The vehicular LED lamp for freezing prevention using a transparent conductive oxide according to claim 9, wherein the conductive heating member is a transparent conductive oxide containing heating member (190) attached to the inner surface of a head lens (160) of the LED lamp.

11. The vehicular LED lamp for freezing prevention using a transparent conductive oxide according to claim 10, further comprising:
- a PCB unit (120) including one or more LEDs and configured to be accommodated in the inner upper portion of the housing (110) to allow the light emitted from the LEDs to be irradiated in an upward or downward direction; and
- a support unit (150) including a pair of retaining protrusions (151) formed thereon so as to be engaged with the inside of the housing (110) to protect the PCB (120), and a pair of lighting lenses (153) formed on the outer surface thereof.

12. The vehicular LED lamp for freezing prevention using a transparent conductive oxide according to claim 9, further comprising:
- a sensor unit (170) having a structure being formed integrally or engaged with the headlamp LED PCB unit (130) at the inside of the housing (110), the sensor unit (170) sensing the internal temperature of the housing (110); and
- a control unit (210) determining the supply of power to a transparent conductive oxide containing heating member based on the internal temperature of the housing (110), sensed by the sensor unit (170), through the control of power of a power supply unit (180).

13. The vehicular LED lamp for freezing prevention using a transparent conductive oxide according to claim 9, further comprising:
- a reflector (140) disposed at the inside of the housing (110) reflecting light emitted from the LEDs of the headlamp LED PCB unit (130), wherein the reflector (140) comprises:
- a reflective plate (141) inserted into an internal space portion and receiving lighting light emitted from the LEDs of the headlamp LED PCB unit (130),
- a frame unit (143) formed to extend protrudingly radially from a front end of the reflective plate (141) in such a manner as to be connected to a front end of the housing (110);
- a pair of opposed electrode guide grooves (145) recessedly formed on the central surfaces of a pair of opposed vertical portions of the frame unit (143); and
- a pair of opposed fastening terminals (147) connected to the LED PCB unit (130) by electric wires and inserted into the pair of opposed electrode guide grooves (145) so that when the head lens (160) and the housing (110) are securely fastened to each other by a bolt (149), an electrical conduction is established between the headlamp LED PCB unit (130) and the head lens (160).

14. The vehicular LED lamp for freezing prevention using a transparent conductive oxide according to claim 9, wherein the reflective plate (141) allows the light emitted from the LEDs of the headlamp LED PCB unit (130) to be reflected to the inner surface of the head lens (160), and to have a curved shape so as to condense and reflect the lighting light emitted from the LEDs of the headlamp LED PCB unit (130), the reflective plate (141) being accommodated in the internal space of the housing (110).

15. The vehicular LED lamp for freezing prevention using a transparent conductive oxide according to claim 14, wherein the transparent conductive oxide containing heating member (190) comprises a substrate film (191), an optical adjustment layer (193) laminated on the substrate film (191) and including a low refractive index layer, and a coating layer formed on the optical adjustment layer and coated with a resin coating solution containing a fluorine additive.

\* \* \* \* \*